(12) United States Patent
De Sandre et al.

(10) Patent No.: US 7,227,765 B2
(45) Date of Patent: Jun. 5, 2007

(54) CONTENT ADDRESSABLE MEMORY CELL

(75) Inventors: Guido De Sandre, Brugherio (IT); Roberto Bez, Milan (IT); Fabio Pellizzer, Follina (IT)

(73) Assignees: STMicroelectronics S.r.l., Agrate Brianza (IT); Ovonyx, Inc., Boise, ID (US)

( * ) Notice: Subject to any disclaimer, the term of this patent is extended or adjusted under 35 U.S.C. 154(b) by 91 days.

(21) Appl. No.: 10/970,842

(22) Filed: Oct. 20, 2004

(65) Prior Publication Data

US 2006/0018183 A1  Jan. 26, 2006

(30) Foreign Application Priority Data

Oct. 22, 2003  (EP)  ................................. 03103898

(51) Int. Cl.
*G11C 15/00*  (2006.01)
(52) U.S. Cl. .................................... 365/49; 365/189.07
(58) Field of Classification Search .................. 365/49
See application file for complete search history.

(56) References Cited

U.S. PATENT DOCUMENTS

| | | | |
|---|---|---|---|
| 3,544,977 A | 12/1970 | Bohmer | ..................... 340/173 |
| 5,051,948 A | 9/1991 | Watabe et al. | ................ 365/49 |
| 6,304,477 B1 | 10/2001 | Naji | ............................ 365/50 |
| 6,317,349 B1 | 11/2001 | Wong | ........................ 365/49 |
| 6,868,022 B2* | 3/2005 | Scheuerlein et al. | ........ 365/201 |
| 6,909,645 B2* | 6/2005 | Eilert | ......................... 365/200 |
| 2003/0223285 A1* | 12/2003 | Khouri et al. | .............. 365/200 |

FOREIGN PATENT DOCUMENTS

| | | |
|---|---|---|
| EP | 0 230 304 A2 | 7/1987 |
| EP | 1 324 345 | 7/2003 |
| JP | 1-184790 | 7/1989 |

* cited by examiner

*Primary Examiner*—Thong Q. Le
(74) *Attorney, Agent, or Firm*—Lisa K. Jorgenson; Robert Iannucci; Seed IP Law Group PLLC

(57) ABSTRACT

A content addressable memory cell for a non-volatile content addressable memory, including a non-volatile storage element for storing a content digit, a selection input for selecting the memory cell, a search input for receiving a search digit, and a comparison circuit arrangement for comparing the search digit to the content digit and for driving a match output of the memory cell so as to signal a match between the content digit and the search digit. The non-volatile storage element include at least one phase-change memory element for storing in a non-volatile way the respective content digit.

23 Claims, 6 Drawing Sheets

CONTENT ADDRESSABLE MEMORY CELL

BACKGROUND OF THE INVENTION

1. Field of the Invention

The present invention relates in general to a semiconductor memory and, in particular, to a non-volatile Content Addressable Memory (CAM).

2. Description of the Related Art

Unlike conventional memories, CAMs include a plurality of CAM cells that are addressed in response to their content, rather than by a physical address. Words stored in a CAM are accessed, i.e., univocally identified, by applying corresponding data values to input terminals of the CAM. In response to applied data values, a match line of the CAM is driven so as to assert or de-assert an associated match signal, indicating whether or not a stored word matches the applied data values.

CAMs are useful in many applications, such as search engines, in which a list of data values in predetermined order is searched to identify a specific word in the CAM. By identifying which location of the CAM is coupled to a match line driven to assert the match signal, the specific word is identified.

Two types of CAM cells are typically used in CAMs: binary CAM cells and ternary CAM cells. A binary CAM cell can store a high logic value or a low logic value. A ternary CAM cell can store one of three values: a high logic value, a low logic value or a "don't care" value. When the logic values stored in the binary or ternary CAM cells of a CAM location match applied data values, then the match line coupled to that location is driven so as to assert the match signal. Otherwise, when the logic values stored in the binary or ternary CAM cells of a CAM location do not match the applied data values, then the coupled match line is driven so as to de-assert the match signal. In addition, a ternary CAM cell storing a "don't care" value provides a match (or, alternatively, a mismatch) condition irrespective of the data value applied thereto.

Both binary and ternary CAM cells can be either volatile or non-volatile. In particular, volatile CAM cells were initially implemented by exploiting the architecture of static RAM (SRAM) cells and adding transistors for realizing an output of the CAM cell connected to the match line coupled thereto. Recently, volatile CAM cells have been developed based on the dynamic RAM (DRAM) architecture, for reducing the semiconductor area occupied by the relatively high number of transistors employed in a CAM cell based on an SRAM architecture.

The volatile CAM cells, based on SRAM or DRAM cells, have a low access time (lower in SRAM than in DRAM-based CAM cells), but their content is lost during power-down. Consequently, the volatile CAM cells need be re-loaded at every power-on of the CAM, and a separate memory device of non-volatile type, such as a hard disk or an EPROM memory has to be used as a back-up storage unit for the volatile CAM.

The use of two distinct semiconductor memories (distinct chips) is disadvantageous, because very complex and expensive. A wide area on a printed circuit board is to be reserved, additional sockets and interconnections between the two memories are to be provided.

Non-volatile CAMs have been proposed. For example, U.S. Pat. No. 6,317,349 B1 discloses an architecture of ternary non-volatile CAM cell, including two floating gate transistors of the type normally used in flash memories. A floating gate transistor is non-volatily programmed by injecting charges into the floating gate, so as to modify its threshold voltage: for example, a high threshold voltage can be associated with a high logic value, while a low threshold voltage can be associated with a low logic value, or vice versa. This non-volatile CAM cell preserves its content also during power-down and moreover permits the use of a smaller number of transistors in respect to a CAM cell based on SRAM architecture.

In a CAM, the operation of searching a given data word (search operation) needs a preset phase, in which each match line is precharged to a prescribed preset voltage. When a searched word matches the word stored in a CAM location, the match line coupled thereto remains at the preset voltage, while a variation of the voltage at a match line is read as a mismatch. A drawback of the non-volatile CAM cell architecture described in U.S. Pat. No. 6,317,349 B1 is a consequence of the flow of leakage currents through the floating gate transistors with low threshold voltage during the search operation. In a mismatch condition during the search operation, if a number of CAM cells of the same CAM location conduct leakage currents, it may happen that the voltage at the match line does not vary sufficiently to be read as a mismatch. This problem is significant when the threshold voltage of the floating gate transistors is low (a lower threshold voltage implies a greater leakage current), but in any case the leakage currents imply an excessive power consumption. Furthermore, during the search operation it may happen that only one CAM cell of a CAM location shows a mismatch, while all the other CAM cells of the same location show a match. The discharge of the match line coupled to this location from the preset voltage can be very slow and in many applications auxiliary circuits might be necessary, to be associated with such a non-volatile CAM for speeding up the discharge of the match lines and, consequently, the search operation.

The Applicant also observes that a programming operation of floating gate transistors requires a relatively long time, and a preliminary block erasing operation is necessary. The erasing operation can be critical because of the problem of regulating the threshold voltage of the floating gate transistors for limiting the leakage threshold voltage.

BRIEF SUMMARY OF THE INVENTION

One embodiment of the present invention overcomes the above-mentioned drawbacks.

One embodiment of the present invention provides a content addressable memory cell for a non-volatile content addressable memory, including a non-volatile storage element for storing a content digit, a selection input for selecting the memory cell, a search input for receiving a search digit, and a comparison circuit arrangement for comparing the search digit to the content digit and for driving a match output of the memory cell so as to signal a match between the content digit and the search digit. The non-volatile storage element includes at least one phase-change memory element, i.e., a memory element based on a phase-change material, for storing in a non-volatile way the respective content digit.

Moreover, one embodiment of the present invention provides a non-volatile content addressable memory, including an arrangement of a plurality of content addressable memory cells that use phase-change memory elements.

BRIEF DESCRIPTION OF THE SEVERAL VIEWS OF THE DRAWINGS

Further features and the advantages of the present invention will be made clear by the following detailed description of some embodiments thereof, provided purely by way of non-limitative example, description that will be conducted making reference to the attached drawings, wherein.

DETAILED DESCRIPTION OF THE INVENTION

Figure 1:
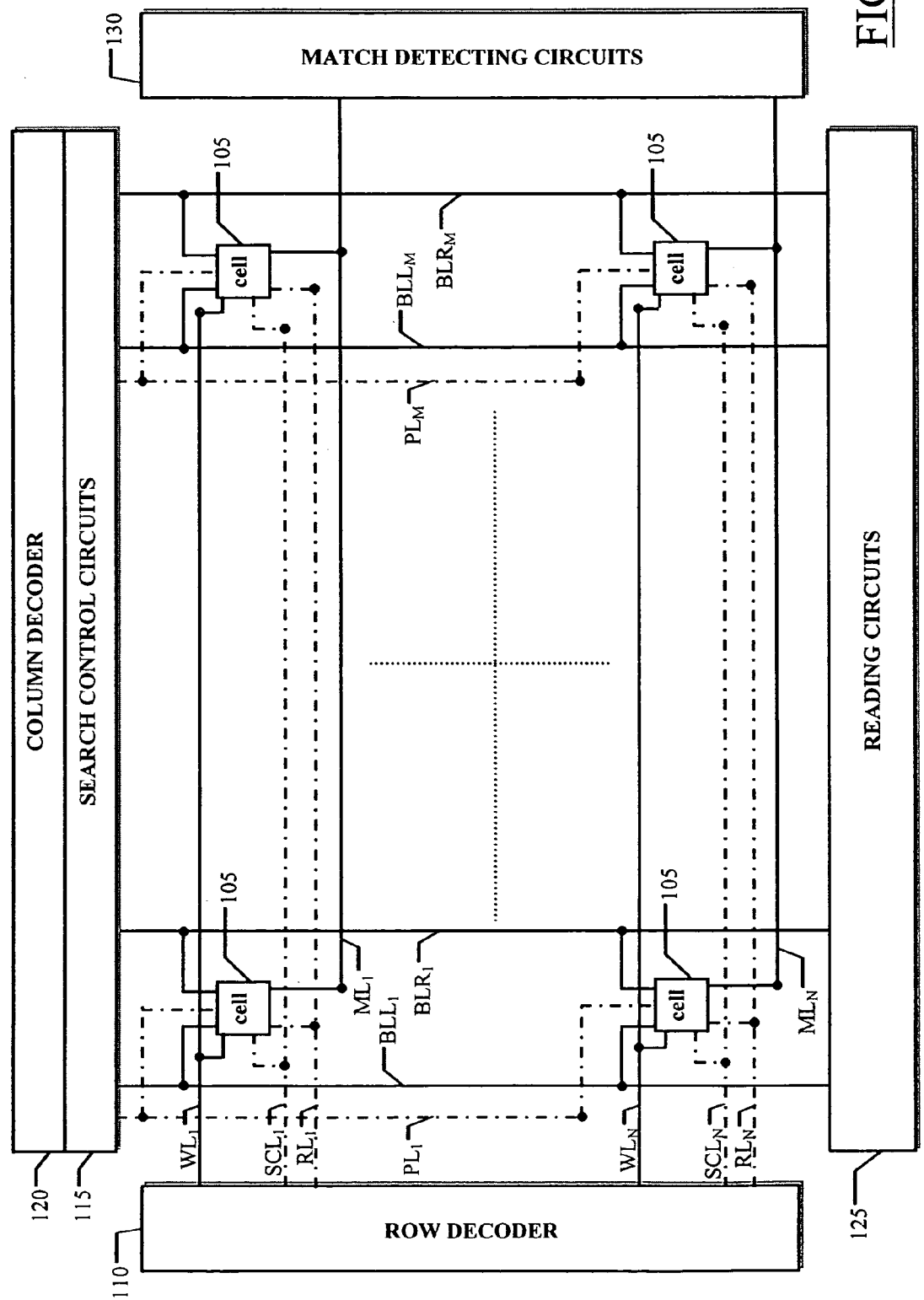
FIG. 1 shows a functional block scheme of a CAM in which the present invention is applicable.

With reference in particular to FIG. 1, a functional block scheme of a CAM 100, in which the present invention is applicable, is shown. The CAM 100 includes a plurality of CAM cells 105, arranged in a two-dimensional disposition, or a matrix, of a number N of rows and a number M of columns. Each row of CAM cells 105 is controlled by a respective wordline $WL_i$ (i=1, ..., N) and each column is controlled by two respective bitlines, in particular a bitline $BLL_j$ and a bitline $BLR_j$ (j=1, ..., M). Each CAM cell 105 is univocally identified by the respective wordline $WL_i$ and the bitlines $BLL_j$ and $BLR_j$; each CAM cell 105 is further connected to a match line $ML_i$, associated with the respective row.

A bit of information is written in each CAM cell 105 and the number M of columns of CAM cells 105 is equal to the length of a word stored in the CAM 100, plus possible auxiliary columns. Reading circuits (schematically shown as a block 125), including in particular sense amplifiers, are connected to the bitlines $BLR_j$, $BLL_j$ and are capable of sensing the content of the CAM cells 105, while match detecting circuits (schematically shown as a block 130) are connected to the match lines $ML_i$ and read the voltage at the match lines $ML_i$.

The CAM 100 also includes a number of auxiliary lines, useful for the operation thereof, such as supply voltage lines and control lines. In particular, each CAM cell 105 can be connected, for example, to a supply voltage line $PL_j$ and/or a reference voltage line $RL_i$ and/or a search control line $SCL_i$ (all these auxiliary lines are represented in dash-and-dot in FIG. 1). The supply voltage lines $PL_j$ supply a supply voltage, that, depending on the specific CAM cell embodiment and/or the operations to be carried out, may be the supply voltage $V_{dd}$ of the CAM 100 (typically, from 1 to 3 V) or a higher voltage, provided by devices (not shown in the drawing) integrated on the same chip, or externally supplied to the CAM 100; the reference voltage lines $RL_i$ supply a reference voltage $V_{ref}$ (i.e., the ground) to the CAM cells 105, if required.

A row decoder 110 is connected to the wordlines $WL_i$ for selecting the desired rows of non-volatile CAM cells 105 and for applying suitable voltages during operation. Search control circuits 115 are connected to the bitlines $BLL_j$, $BLR_j$ for applying suitable voltages during operation in response to control signals provided by a column decoder 120. In particular, during reading and writing operations on the CAM cells 105 the row decoder 110 and the column decoder 120 are responsive to address codes corresponding to respective CAM cells 105. The row decoder 110 is further connected to and drives the reference voltage lines $RL_i$ and the search control lines $SCL_i$, while the search control circuits 115 are also connected to the supply voltage lines $PL_j$.

Figure 2A:
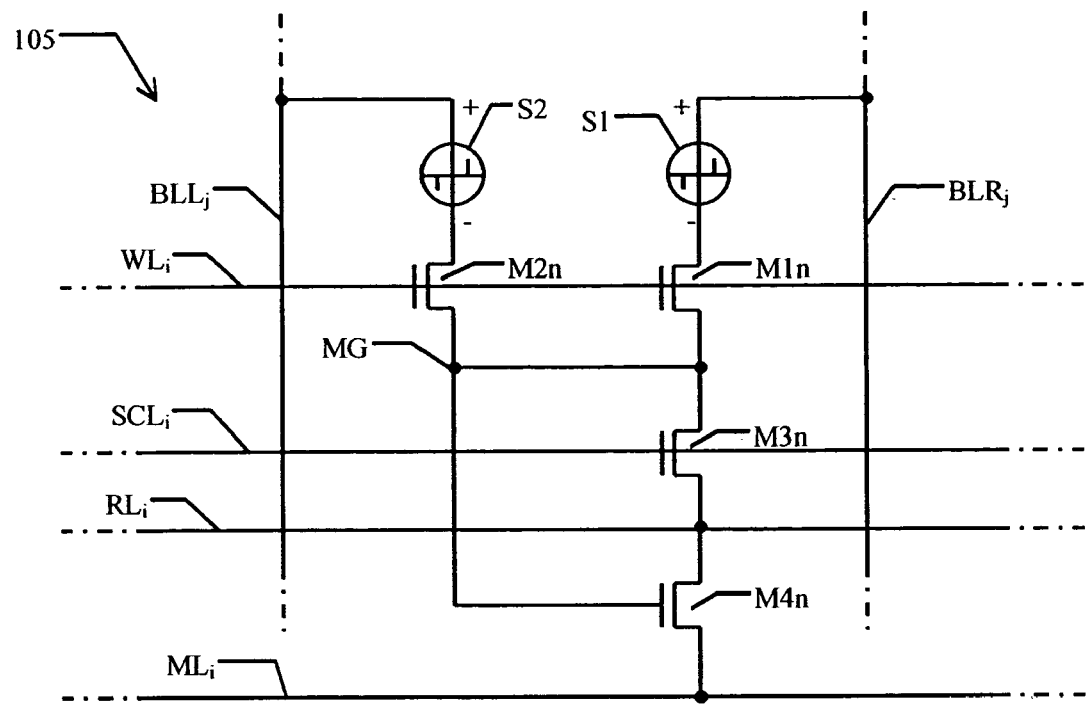
FIG. 2A illustrates a ternary non-volatile CAM cell for a NOR-type CAM architecture, according to a first embodiment of the present invention, wherein phase-change material based elements are exploited as non-volatile storage elements.

Referring to FIG. 2A, a ternary non-volatile CAM cell 105 according to an embodiment of the present invention is shown. The ternary non-volatile CAM cell 105 is implemented by exploiting two phase-change memory (PCM) elements S1, S2.

The PCM elements S1, S2 are based on a phase-change material, typically consisting of a calcogenide (such as a $Ge_2Sb_2Te_5$ alloy) with resistivity changing at phase variations. The phase-change material can be reversibly switched between an amorphous, disordered phase and a crystalline, highly ordered phase. The two phases of the material exhibit different electrical characteristics; particularly, the material in the amorphous phase exhibits high resistivity and this phase can be associated with a first logic value, such as 0 (conventionally, reset state); the material in the crystalline phase exhibits low resistivity (about one hundred times lower than the resistivity of the material in the amorphous phase) and this phase can be associated with a second logic value, such as 1 (set state).

Without descending into particulars well known in the art, the material phase is stable below a given temperature $T_s$ (such as 150° C.) and, consequently, the phase-change material can be used for implementing a non-volatile storage element, such as the PCM elements S1, S2. The material phase can be changed by heating the material above the temperature $T_s$. From the electrical standpoint, the phase-change material in the PCM elements S1 and S2 can be heated by causing a current to flow through a resistive element (or heater) embedded in the PCM elements S1, S2: the heat generated by Joule effect heats the phase-change material accordingly.

Figure 3:
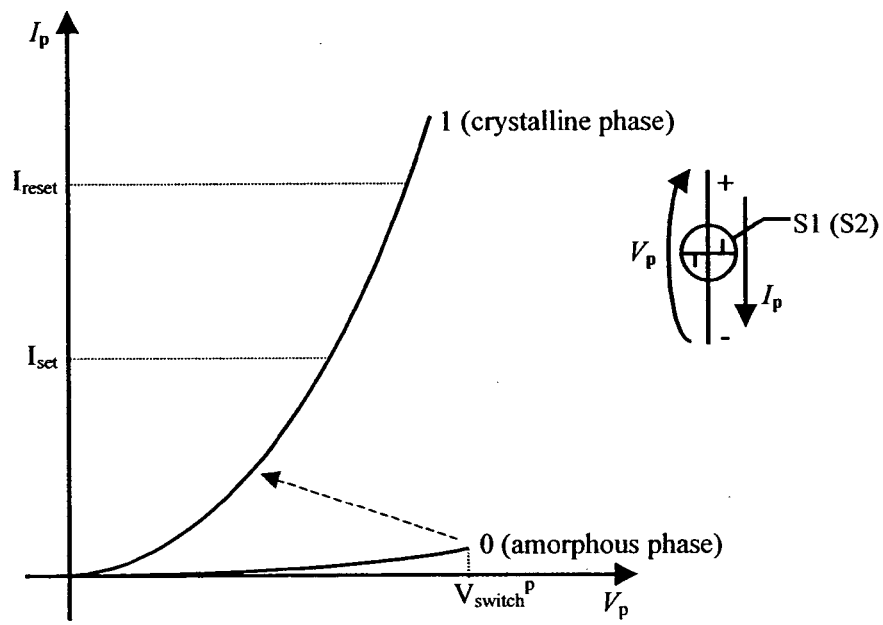
FIG. 3 shows current-voltage (I-V) characteristic curves of a phase-change memory element used in the non-volatile CAM cell of FIGS. 2A and 2B.

Considering FIG. 3, current-voltage (I-V) characteristic curves of a generic PCM element (S1 or S2) in the set and reset states are shown. A voltage between a negative terminal ("−" in the drawing) and a positive terminal ("+") of the PCM element S1 (S2) is referred to as $V_p$ and a current flowing from the positive terminal to the negative terminal is referred to as $I_p$.

If the current $I_p$ reaches a given "set" value $I_{set}$ (for example, 300 µA), the temperature of the phase-change material raises over a nucleation temperature (such as 200° C.) and, when cooled slowly (e.g., in around 100 ns), the phase-change material becomes crystalline. If the current $I_p$ is raised up to a given "reset" value $I_{reset}$ greater than the set value $I_{set}$ (roughly, twice the value $I_{set}$ and, for example, equal to 500 μA), the temperature of the phase-change material raises over a melting temperature (such as 600° C.) and, when cooled rapidly (e.g., in around 10 ns or less), the phase-change material becomes amorphous. The current values $I_{set}$, $I_{reset}$, used for programming the PCM element S1 (S2), are indicated on the I-V characteristic curve of the crystalline phase.

When the voltage $V_p$ is significantly lower than a switch value $V_{switch}^p$ (typically, approximately from 1 to 1.5 V), both the set and the reset states of the PCM element S1 (S2) are stable and the resulting value of the current $I_p$ is a signature of the resistivity of the phase-change material; the current $I_p$ thus corresponds to the stored logic value. In FIG. 3 the resulting I-V characteristic curves of the PCM element S1 (S2) outline the difference between the high resistance (typically, from 50 to 150 kΩ) exhibited when the logic value 0 is stored and the low resistance (typically, from 2 to 4 kΩ) when the logic value 1 is stored.

In operation, if the phase-change material is in the amorphous phase (i.e., if the logic value 0 is stored), when the voltage $V_p$ exceeds the switch value $V_{switch}^p$, the resistivity of the phase-change material becomes very similar to the resistivity in the crystalline phase and the resulting current $I_p$ flowing through the PCM element S1 (S2) can modify the state of the phase-change material (that may become crystalline). Consequently, the stored logic value 0 might be turned into a 1; as a consequence, the voltage $V_p$ should not exceed the switch value $V_{switch}^p$, in order to avoid the risk of spurious programming.

Referring back to FIG. 2A, the CAM cell 105 further includes four n-MOS transistors M1n, M2n, M3n and M4n. The PCM element S1 has the positive terminal connected to the bitline $BLR_j$ and the negative terminal connected to the drain terminal of the transistor M1n. The PCM element S2 has the positive terminal connected to the bitline $BLL_j$ and the negative terminal connected to the drain terminal of the transistor M2n.

The transistors M1n and M2n have the gate terminals both connected to the wordline $WL_i$ and the source terminals connected together to a match node MG. The drain terminal of the transistor M3n and the gate terminal of the transistor M4n are also connected to the match node MG. The source terminal of the transistor M3n and a first source/drain terminal of the transistor M4n are connected together to the reference voltage line $RL_i$; a second source/drain terminal of the transistor M4n is connected to the match line $ML_i$ and the gate terminal of the transistor M3n is connected to the search control line $SCL_i$. In this way, the transistors M1n and M21n act as selecting elements for the PCM elements S1, S2, respectively, while the transistors M3n and M4n act as switching elements, controlled by the voltages at the search control line $SCL_i$ and the match node MG, respectively; in particular, the transistor M3n is used for selectively connecting the match node MG to the reference voltage line $RL_i$ (thus for discharging the match node MG to the reference voltage).

The reading operation is performed on the selected CAM cell 105 by sensing the current flowing in each one of the two PCM elements S1, S2 by means of the reading circuits 125. For this purpose, a wordline read voltage $V_{read}^{WL}$ (such as 3 V) is applied to the selected wordline $WL_i$ for selecting the row of the CAM cell 105 in read mode, and a bitline read voltage $V_{read}^{BL}$ (typically a voltage between 0.2 and 0.8 V), suitably lower than the switch voltage $V_{switch}^p$ of the PCM elements S1 and S2,1 is applied to the selected bitlines $BLL_j$ and $BLR_j$. At the same time, the reference voltage line $RL_i$ is set to the ground voltage and the search control line $SCL_i$ is set to a relatively high voltage (such as 3 V) so that the transistor M3n is turned on and strongly couples the match node MG to ground. The wordline $WL_i$ and the bitlines $BLL_j$ and $BLR_j$ are for example selected supplying suitable address codes to the row decoder and the column decoder.

Differently from a reading operation, a writing operation is performed on the two PCM elements S1, S2 separately; a suitable current pulse is applied to one of the two PCM elements S1 and S2 at a time. When a low logic value has to be written into the selected PCM element S1, S2, the current pulse has to be of relatively short time duration and with an amplitude equal to the reset current $I_{reset}$. When a high logic value has to be written into the selected PCM element S1, S2, the current pulse has to be of long time duration and with an amplitude equal to the set current $I_{set}$. The selected wordline $WL_i$ is set to a relatively high voltage (e.g., from 3 to 5 V), the reference voltage line $RL_i$ is set to the ground voltage and the search control line $SCL_i$ is set to a relatively high voltage (for example, between 3 and 5 V), for strongly coupling the match node MG to ground, as in the above described reading operation. One of the two bitlines $BLL_j$ and $BLR_j$ is raised to a suitable high voltage, for example from 3 to 5 V, while the other is set to a low voltage, typically between 0.4 and 0.7 V. Particularly, depending on the logic value to be programmed into the selected element S1, S2, for permitting the flow of the reset current $I_{reset}$ or the set current $I_{set}$ through the PCM element S1, S2, a suitable voltage (typically, in the range from 3.0 to 5.0 V) is applied to the respective bitline $BLL_j$, $BLR_j$ for a predetermined time. Bitline driver circuits (not shown in the drawing) can act as current limiting devices for regulating the voltage at the bitlines $BLL_j$, $BLR_j$ in such a way to permit the flow of a suitable current pulse, irrespective of the state of the PCM element S1, S2.

The CAM cell 105 can be programmed in four possible storage states, depending on the logic values written in the two PCM elements S1, S2, as defined in Table 1.

TABLE 1

| S1 logic value | S2 logic value | CAM cell storage state |
| --- | --- | --- |
| 1 | 1 | not used |
| 1 | 0 | 1 |
| 0 | 1 | 0 |
| 0 | 0 | Always Match (AM) |

The two storage states in which one of the two PCM elements S1, S2 is set to the logic value 1 and the other to the logic value 0 are used to store one bit of a data word, hereinafter referred to as a content bit. In particular, when the PCM element S1 is set to 1 and the PCM element S2 is set to 0, the content bit is equal to 1; in the opposite case, the content bit is equal to 0 (the opposite convention can of course be adopted). The storage state in which both the two PCM elements S1 and S2 are set to the logic value 1 is referred to as Always Match (AM) state. The storage state in which both the two PCM elements S1 and S2 are set to the logic value 0 is not intended for use.

During a search operation of a given word, the search control circuits 115 simultaneously apply to the bitlines $BLR_j$ and $BLL_j$ voltages corresponding to the bits to be searched, hereinafter referred to as input or search bits. The row decoder 110 selects all the rows of the CAM 100, by applying a wordline search voltage $V_{search}^{WL}$ (typically, from 3 to 5 V) to every wordline $WL_i$. In addition, the row decoder 110 precharges all the match lines $ML_i$ to a relatively high preset voltage $V_{ML}$ (typically, from 1.0 to 3.0 V) and sets all the reference voltage lines $RL_i$ to the ground voltage; all the search control lines $SCL_i$ are temporarily brought to a voltage sufficiently high for turning the transistor M3n on, thereby presetting the voltage of the match node MG to the ground voltage.

Supposing that the content bit in a given CAM cell 105 is 0, the respective PCM element S1 shows a high resistance, while the PCM element S2 shows a low resistance. If an input bit equal to 1 is being searched (thus, the input bit does not match the content bit in the CAM cell 105), the bitline $BLL_j$ is set to a bitline search voltage $V_{search}^{BL}$ (from 0.8 to 1.0 V) and the bitline $BLR_j$ is kept at a low search voltage $V_{low}$ (from 0.4 to 0.6 V). The voltage at the match node MG depends on a partition of the voltage ($V_{search}^{BL}-V_{low}$) across the PCM element S1 and the transistor M1n, and the PCM element S2 and the transistor M2n. The PCM element S1 shows a high resistance and, consequently, the impedance of a circuital branch between the bitline $BLR_j$ and the match node MG, consisting of the PCM element S1 and the transistor M1n, is high and does not significantly influence the voltage at the match node MG. On the contrary, the PCM element S2 shows a low resistance and the node MG is pulled towards the bitline search voltage $V_{search}^{BL}$, because the transistors M2n is on. Therefore, the transistor M4n turns on and the match line $ML_i$ is pulled towards the ground voltage, i.e., a voltage lower than the preset voltage $V_{ML}$. The match detecting circuits 130 sense the difference between the preset voltage $V_{ML}$ and the voltage dynamically reached at the match line $ML_i$, thus detecting the bit-mismatch situation.

Only one bit-mismatch in a row is sufficient to cause the associated match line $ML_i$ to be pulled towards the ground voltage, thus a bit-mismatch in a row causes a word-mismatch to be declared. If no CAM locations contain the searched data word, all the match lines $ML_i$ are pulled to ground, and the match detecting circuits 130 thus declare a miss.

If an input bit equal to 0 is being searched (thus, the input bit matches the content bit in the CAM cell 105), the bitline $BLR_j$ is set to the bitline search voltage $V_{search}^{BL}$ and the bitline $BLL_j$ is kept at the low search voltage $V_{low}$. The PCM element S2 shows a low resistance and, being the transistor M2n turned on, the match node MG is pulled towards $V_{low}$. Therefore, the transistor M4n is kept turned off, revealing a bit-match. The match line $ML_i$ is kept at the preset voltage $V_{ML}$ only if a bit-match occurs in all the CAM cells 105 of the associated row; the fact that the voltage at the match line $ML_i$ does not change from the preset voltage $V_{ML}$ is read by the match detecting circuits 130 as a word-match.

During the search operation, the response of a CAM cell 105 storing a content bit equal to 1 is similar to the above described one, thanks to the architectural symmetry of the CAM cells 105.

If the CAM cell 105 is in the AM storage state, then both the PCM elements S1 and S2 show a high resistance and the node MG is always kept at the low search voltage $V_{low}$; the transistor M4n is turned off irrespective of the voltage applied to the bitlines $BLL_j$, $BLR_j$. In this way, whichever the input bit fed to the CAM cell 105, a situation similar to a bit-match is produced. The AM state is useful, for example, for adapting a CAM with a certain number M of columns to the use in applications in which the word to be searched has a number of bits lower than M.

It is also possible to mask one or more of the input bits to be applied to the CAM. In fact, by setting both the bitlines $BLL_i$ and $BLR_i$ to the low search voltage $V_{low}$, a bit-match is produced whichever the content bit.

Alternatively, before starting a search operation, a reference voltage $V_{ref}$ (for example, 1.8 V), higher than the ground voltage, can be applied to the reference voltage line $RL_i$, while the preset voltage $V_{ML}$ at the match line $ML_i$ can be equal to the ground voltage. In this alternative preset condition, when a bit-mismatch occurs, the match line $ML_i$ voltage does not undergo the complete swing from the preset voltage $V_{ML}$ to the reference voltage $V_{ref}$ as in the previous case, but the voltage swing is now equal to $V_{search}^{BL}-V_{ML}-V_{th4}$, where $V_{th4}$ is the threshold voltage of the transistor M4n. Consequently, the power consumption is reduced at each search operation.

It is observed that the bitline search voltage $V_{search}^{BL}$ to be used depends on the threshold voltage of the transistor M4n; a higher threshold voltage imposes the use of higher search voltages at the bitlines $BLL_j$ and $BLR_j$ for turning the transistor M4n on in case of a bit-mismatch.

Furthermore, a combination of the above described operation conditions is possible, i.e., the node MG can be preset to a higher voltage than the ground voltage, for reducing the voltage swing at the node MG when a higher bitline search voltage is needed for turning the transistor M4n on.

According to still another alternative, both the reference voltage line $RL_i$ and the match line $ML_i$ can be preset to a relatively low voltage, e.g., 1.8 V. In this case, the bitline search voltage $V_{search}^{BL}$ shall be high enough to make the transistor M4n conductive even in presence of a non-negligible body effect. The search operation can include an active probing, in which the match line $ML_i$ is initially pulled down to the ground voltage for a relatively short time. If the voltage dynamically reached at the match line $ML_i$ is the ground voltage, the transistors M4n in all the CAM cells 105 of the row are off and a word-match is thus detected (the match line $ML_i$ sees a high impedance); differently if the voltage dynamically reached at the match line $ML_i$ raises towards the voltage at the reference voltage line $RL_i$, the transistor M4n in at least one CAM cell 105 is on, therefore a word-mismatch is determined to have occurred (a low impedance exists between the reference voltage line $RL_i$ and the match line $ML_i$).

Figure 2B:
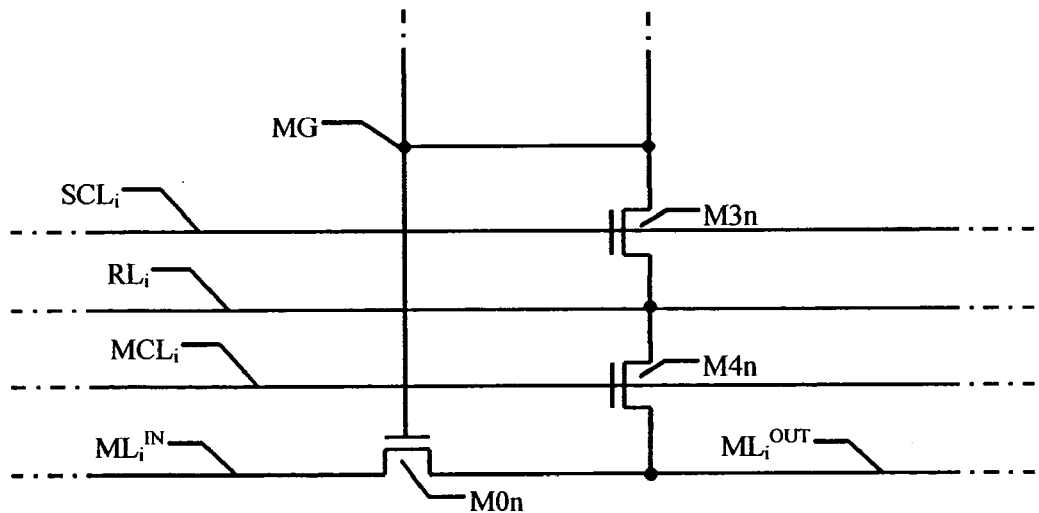
FIG. 2B illustrates a detail of a ternary non-volatile CAM cell similar to that of FIG. 1, modified for making it adapted to an AND-type CAM architecture.

This arrangement of CAM cells 105 is defined as of NOR-type, because the transistor M4n in the generic cell, when turned on, acts as a parallel connection element between the match line $ML_i$ and the reference voltage line $RL_i$. It is observed that an AND-type arrangement can also be implemented, as schematically shown in FIG. 2B, e.g., by connecting a further transistor M0n of the generic CAM cell, driven by the match node MG, in series to the match line $ML_i^{IN}-ML_i^{OUT}$, while the transistor M4n has the gate terminal connected to a match control line $MCL_i$. In this way the transistors M0n of the CAM cells of a row are connected in series along the respective match line.

Compared to a volatile CAM cell based on the SRAM architecture, the proposed non-volatile CAM cell 105 allows reducing the number of transistors, and thus the area of semiconductor occupied. At the same time, the desired non-volatility is achieved by means of the PCM elements, which can be easily integrated slightly modifying pre-existing fabrication processes of integrated circuits, permitting a simple architecture of the non-volatile CAM.

Furthermore, the exploitation of storage elements made by a phase-change material permits the implementation of a non-volatile CAM intrinsically hard to radiations, easily and quickly re-programmable (a preliminary erasing process is not required) and even operatively faster than a non-volatile CAM exploiting floating gate transistors.

In the above-described non-volatile CAM cell, a current ranging from 2 μA to 8 μA is required by each cell during a search operation. This means that the size of the CAM might be limited by the maximum available power.

Figure 4A:
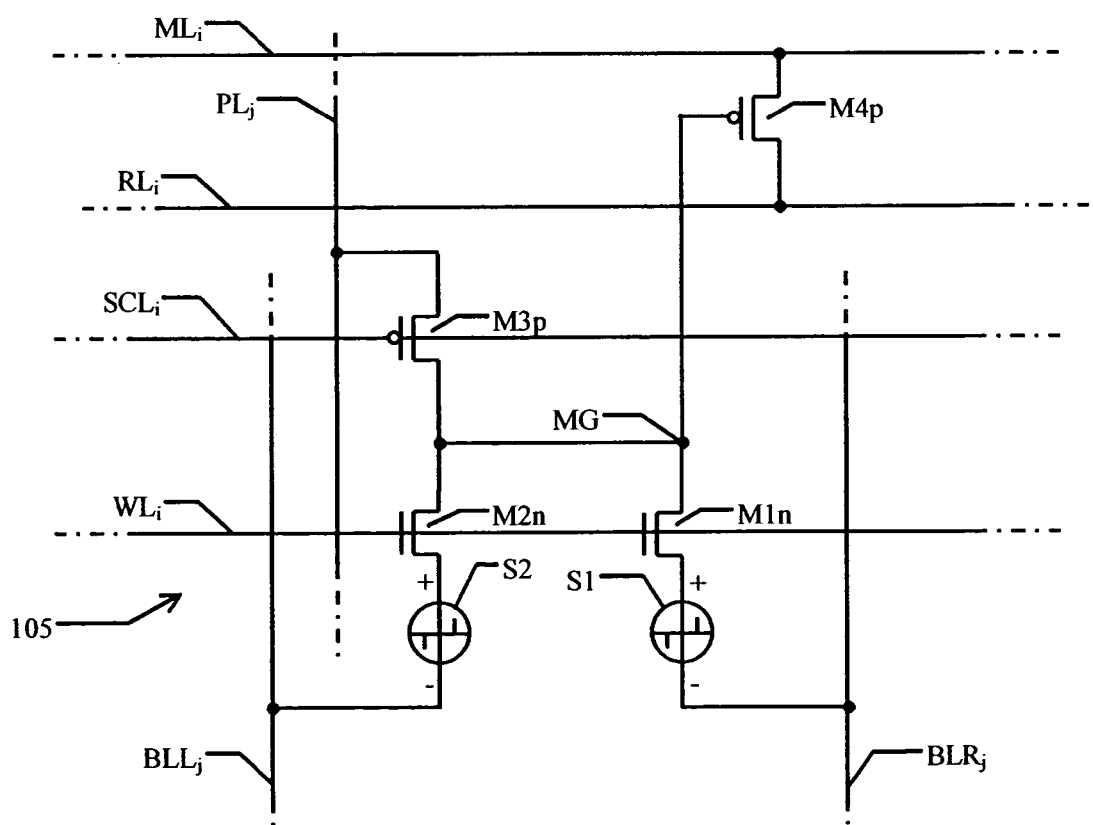
FIG. 4A illustrates a ternary non-volatile CAM cell for a NOR-type CAM according to a second embodiment of the present invention.

FIG. 4A shows a non-volatile CAM cell 105, according to a further embodiment of the present invention (the elements corresponding to those depicted in FIG. 2A are denoted with the same reference numerals and their description is omitted for the sake of simplicity). The two PCM elements S1, S2, acting as non-volatile storage elements, have the negative terminals connected to the bitlines $BLR_j$ and $BLL_j$, respectively.

The n-MOS transistors M1n and M2n, with the gate terminal connected to the wordline $WL_i$, have the source terminals connected to the negative terminals of the PCM element S1 and S2, respectively, and the drain terminals connected together to the match node MG.

Two p-MOS transistors M3p and M4p replace the n-MOS transistors M3n and M4n of the embodiment of FIG. 2A. The p-MOS transistor M3p has the drain terminal connected to the node MG (consequently to the drain terminals of the n-MOS transistors M1n, M2n) and the source terminal connected to the supply voltage line $PL_j$, which provides the supply voltage $V_{dd}$. The gate terminal of the p-MOS transistor M3p is connected to the search control line $SCL_i$, which is used for driving the transistor M3p (as in the case of the transistor M3n shown in FIG. 2A). The transistor M3p acts as a switch for providing the supply voltage $V_{dd}$ to the node MG. The p-MOS transistor M4p has the source terminal connected to the match line $ML_i$ and the drain terminal connected to the reference voltage line $RL_i$, which provides the ground voltage. The gate terminal of the p-MOS transistor M4p is connected to the node MG and the voltage at the node MG drives the transistor M4p.

The reading operation is performed by selecting a row of CAM cells 105, i.e., by setting the wordline $WL_i$ and the bitlines $BLL_j$ and $BLR_j$ to voltages between the ground voltage and the supply voltage $V_{dd}$ (e.g., the wordline $WL_j$ is set to 2.0 V). Then, the search control line $SCL_i$ is set to the ground voltage, the p-MOS transistor M3p turns on and the node MG raises to the supply voltage $V_{dd}$, turning the p-MOS transistor M4p off. For reading the logic value stored in either one of the PCM elements S1, S2, the corresponding bitline $BLL_j$ or $BLR_j$ is pulled to a lower voltage (e.g., 1.0 V) than the voltage at the match node MG.

During the writing operation, the CAM cell 105 is selected (and the n-MOS transistors M1n, M2n are turned on) by applying the supply voltage $V_{dd}$ to the corresponding wordline $WL_i$; the corresponding bitlines $BLL_j$ and $BLR_j$ are initially set to the supply voltage $V_{dd}$. The search control line $SCL_i$ is set to the ground voltage, turning the p-MOS transistor M3p on, and, in order to deliver a suitable current pulse to each one of the PCM elements S1, S2, the bitlines $BLL_j$ and $BLR_j$ are alternatively pulled towards ground. The bitline driver circuits can regulate the voltage at the bitlines $BLL_j$, $BLR_j$, as described with reference to the embodiment of FIG. 2A. Also in this embodiment, the CAM cell 105 can be set in either one of the four storage states defined in Table 1 (the storage state in which both the PCM elements S1 and S2 show low resistance is still not used).

Before starting a search operation, the wordline $WL_i$ reaches a voltage such that each one of the n-MOS transistors M1n and M2n conducts a prescribed current $I_{SN}$ (for example, 800 nA) in the case in which the respective source terminal is at ground. The bitlines $BLL_j$ and $BLR_j$ are preset to a positive low voltage, for example between 0.5 and 1.0 V, suitable to keep the transistors M1n, M2n turned off. A voltage at the search control line $SCL_i$ is such that the p-MOS transistor M3p conducts a current $I_{SP}$, lower than $I_{SN}$ (for example of 400 nA); the node MG is thus preset to the supply voltage $V_{dd}$, the n-MOS transistors M1n, M2n being initially turned off. The match line $ML_i$ is preset to the preset voltage $V_{ML}$ (for example, between 1 and 3 V).

For starting the search operation, the voltage at the bitlines $BLL_j$, $BLR_j$ is varied according to the input bit to be searched. Let it be supposed that the input bit applied to the CAM cell 105 is 1 and that the content bit of the CAM cell 105 is 0 (the PCM element S1 exhibits high resistance and the PCM element S2 exhibits low resistance). The input bit 1 is applied to the CAM cell 105 by pulling the voltage at the bitline $BLL_j$ down to the ground voltage, while the bitline $BLR_j$ is left at the preset voltage. In this condition, the transistor M1n is turned off, while the transistor M2n conducts a current almost equal to $I_{SN}$, because the source terminal thereof is approximately at the ground voltage. Consequently, a current equal to the difference $I_{SN}-I_{SP}$ (800 nA−400 nA=400 nA in the example) pulls the match node MG down towards the ground voltage, the transistor M4p is turned on, and thus the match line $ML_i$ is also pulled down towards ground (i.e., the ground voltage plus the threshold voltage of the transistor M4p), indicating a bit-mismatch (and consequently, a word-mismatch).

When the input bit 0 is applied to the CAM cell 105, the voltage at the bitline $BLR_j$ is pulled down to the ground voltage, while the bitline $BLL_j$ is left at the preset voltage. In this case the transistor M2n is turned off, while the transistor M1n is turned on. However, the high resistance exhibited by the PCM element S1 limits the current that can flow through the transistor M1n to a value smaller than $I_{SN}$ (the source terminal of the transistor M1n is not in this case pulled down to ground). Consequently, the match node MG is not pulled down to ground, remaining substantially at the supply voltage $V_{dd}$; the transistor M4p is thus kept off and the voltage at the match line $ML_i$ does not move from the preset voltage $V_{ML}$, indicating a bit-match.

Compared to the CAM cell of FIG. 2A, this second embodiment of CAM cell allows limiting the current required at every search operation.

It is observed that the series connection of the p-MOS transistor M3p and the n-MOS transistor M1n (M2n) may make the CAM cell difficult to be written in the case the PCM elements S1, S2 need a large current to be set/reset; in fact, the current that is allowed to flow through the PCM element S1 (S2) is limited by the series connection of the transistors M3p and M1n (M2n) for writing the CAM cell 105.

Figure 4B:
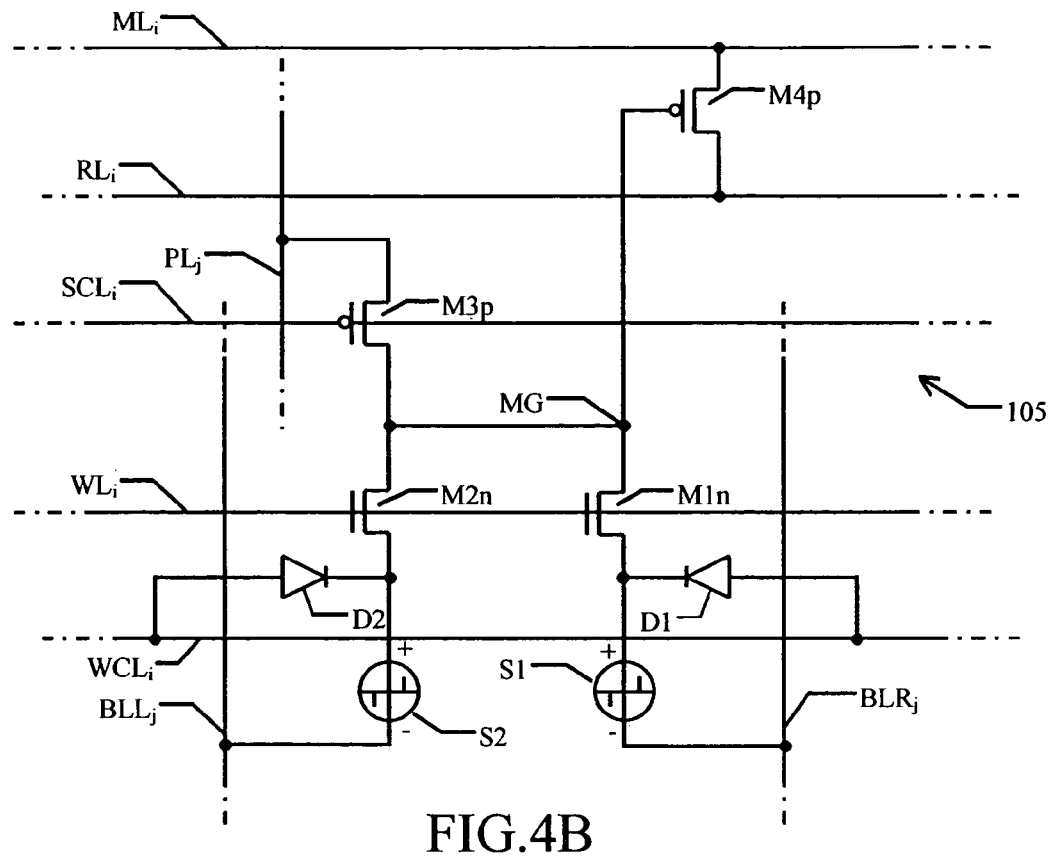
FIG. 4B shows a variation of the embodiment of FIG. 4A.

A further embodiment of ternary non-volatile CAM cell 105 according to the present invention, adapted to overcoming this possible problem, is shown in FIG. 4B (the elements corresponding to those in FIG. 2A and FIG. 4A are denoted with the same reference numerals and their description is omitted for the sake of simplicity). With respect to the embodiment illustrated in FIG. 4A, two diodes D1, D2 are added, each one having the cathode connected to the source terminal of a respective one of the transistors M1n, M2n, and the anode connected to an additional writing control line $WCL_i$ associated with all the CAM cells of a same row.

The writing control line $WCL_i$ is normally kept at the ground voltage, except during a writing operation, when the writing control line $WCL_i$ is brought to the supply voltage $V_{dd}$. In order to write the CAM cell 105, one among the bitlines $BLL_j$ and $BLR_j$, depending on the content bit to be stored, is pulled down to the ground voltage, permitting the flow of a current through the corresponding diode D1 or D2. The currents flowing through the diode D1, D2 is injected into the respective PCM element S1, S2, thus contributing to the programming current thereof.

Alternatively, the diodes D1, D2 can be replaced by selectively activatable conductive elements, such as p-MOS transistors, for contributing to the current flowing through the PCM elements S1 and S2 during a writing operation.

In a further alternative embodiment of the present invention, the p-MOS transistor M4p can be replaced by a n-MOS transistor, for a better drive of the match line $ML_i$ towards a low-level voltage. Before starting the search operation, the wordline $WL_i$ is set to the voltage such that each one of the n-MOS transistors M1n, M2n conducts the prescribed current $I_{SN}$, as in the above described embodiment. However, in this case the search control line $SCL_i$ has to be preset to the supply voltage $V_{dd}$, for turning the transistor M3p off, and the input bit is imposed to the bitlines $BLL_j$, $BLR_j$, i.e., at least one of the bitlines $BLL_j$, $BLR_j$ is at the ground voltage, for presetting the node MG to the ground voltage by the flow of the small current $I_{SN}$. The search operation starts when the voltage at the search control line $SCL_i$ is pulled down to the bias voltage needed to cause the current $I_{SP}$ flowing through the transistor M3p.

Figure 4C:
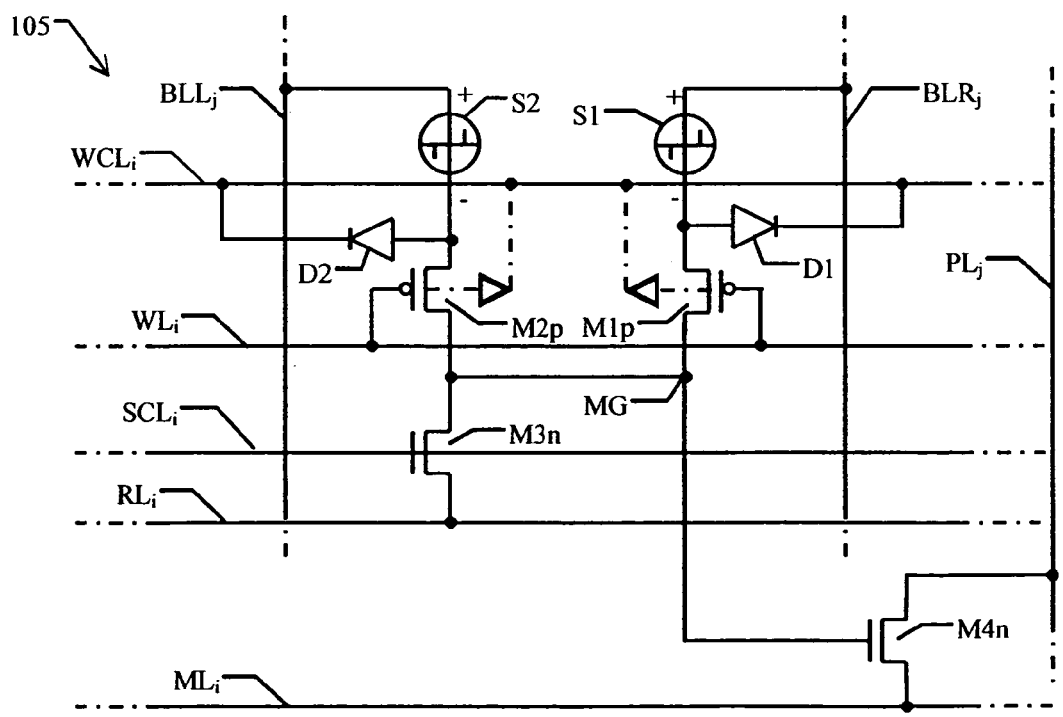
FIG. 4C illustrates a ternary non-volatile CAM cell having an architecture complementary to that of FIG. 4B.

Referring to FIG. 4C, an alternative embodiment is shown, in which the ternary non-volatile CAM cell 105 has a complementary architecture compared to that depicted in FIG. 4B. In detail, the two n-MOS transistors M1n, M2n are replaced by two p-MOS transistors M1p, M2p, and the two p-MOS transistors M3p, M4p are replaced by two n-MOS transistors M3n, M4n, respectively.

In this embodiment, the PCM elements S1 and S2 have the positive terminals connected to the bitlines $BLL_j$ and $BLR_j$, and the negative terminals connected to the source terminals of the p-MOS transistors M1p and M2p, respectively. The n-MOS transistor M3n has the source terminal connected to the reference voltage line $RL_i$; the n-MOS transistor M4n has the source terminal connected to the match line $ML_i$ and the drain terminal connected to the supply voltage line $PL_j$. The two diodes D1 and D2, if provided, have the anodes connected to the source terminals of the transistors M1p and M2p, respectively, and the cathodes connected to the writing control line $WCL_i$. It is observed that the diodes D1, D2 might be represented by the pn junction formed by the p-type source region of the transistors M1p and M2p and the respective n-well, wherein the transistors are formed; to this purpose, the n-well should be directly connected to the writing control line $WCL_i$ for being biased to the desired voltage (the connection is represented in dash-and-dot line in the drawing).

The operation voltages have to be changed accordingly and, in particular, during the writing operation the writing control line $WCL_i$, normally kept at the supply voltage $V_{dd}$ (for example, from 1 to 3 V), is brought to the ground voltage. In order to write the CAM cell 105, the wordline $WL_i$ is pulled down to the ground voltage and one of the bitlines $BLL_j$ and $BLR_j$ at the time is pulled up to a voltage suitable for setting or resetting the corresponding PCM element S1, S2, depending on the content bit to be stored, while the other bitline is kept at the ground voltage.

For presetting the match node MG to the ground voltage, the search control line $SCL_i$ is biased to a voltage such that the n-MOS transistor M3n can conduct the current $I_{SP}$, when the source terminal thereof is at the ground voltage. The wordline $WL_i$ is biased to a voltage such that each of the p-MOS transistors M1p and M2p can conduct the current $I_{SN}$, when the source terminal thereof is at the supply voltage $V_{dd}$. Being the bitlines $BLL_j$, $BLR_j$ preset to a low voltage (or the ground voltage), the p-MOS transistors M1p, M2p do not conduct current, and the match node MG reaches the ground voltage. The match line $ML_i$ is preset to the ground voltage.

For starting the search operation, at least one of the bitlines $BLL_j$, $BLR_j$ is pulled up to the supply voltage $V_{dd}$, depending on the input bit to be searched. In case of a bit-mismatch, the match node MG moves towards the supply voltage $V_{dd}$, thus turning the transistor M4n on; the match line $ML_i$ is thus pulled up towards the supply voltage $V_{dd}$, provided by the supply voltage line $PL_j$, minus the threshold voltage of the transistor M4n. When the input bit matches the content bit, as well as when the CAM cell 105 is programmed in the AM storage state, the match node MG is kept at the ground voltage and, consequently, the transistor M4n of the CAM cell 105 is kept off.

In general, the search operation can also be dynamic, i.e., the voltage at the bitlines $BLL_j$ and $BLR_j$ can be pulsed accordingly to the input bit, with pulses having duration of the order of nanoseconds. The bitlines $BLL_j$ and $BLR_j$ are preset to a relatively low voltage and the voltage pulses are from this preset voltage to the ground voltage in the case of the embodiments of FIGS. 4A, 4B, and to the supply voltage $V_{dd}$ in the case of the embodiment of FIG. 4C. The transistor M3n or M3p, connected between the match node MG and the reference voltage line $RL_i$ or the supply voltage line $PL_j$, can be used as a simple switch for presetting the node MG. During the dynamic search operation, the transistor M3n or M3p is turned off and the voltage at the match node MG can move, turning the transistor M4n or M4p on, only if a bit-mismatch occurs, i.e., only if the voltage pulse is applied to the bitline $BLL_j$, $BLR_j$ connected to the PCM element S1, S2 exhibiting a low resistance.

Figure 5A:
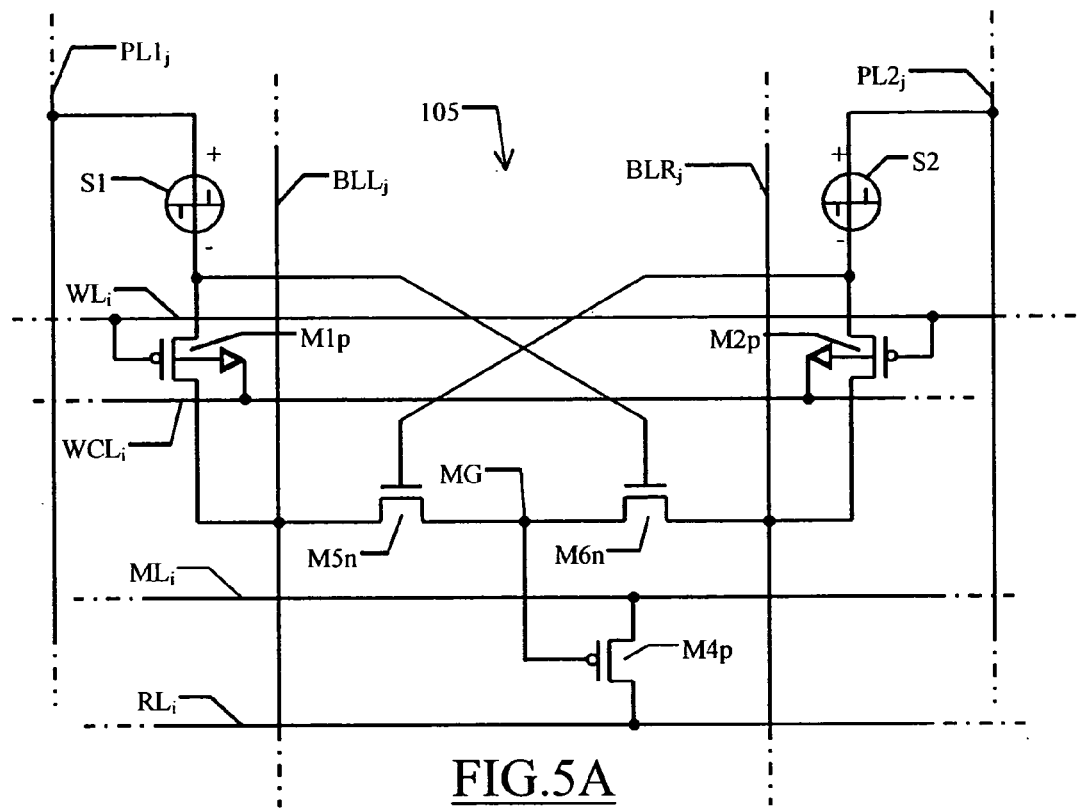
FIG. 5A illustrates a ternary non-volatile CAM cell for a NOR-type CAM according to a third embodiment of the present invention.

Referring to FIG. 5A, a ternary non-volatile CAM cell according to a further embodiment of the present invention is illustrated (the elements corresponding to those in FIGS. 2A–4C are denoted with the same reference numerals and their description is omitted for the sake of simplicity). The CAM cell 105 is coupled to two supply voltage lines $PL1_j$, $PL2_j$ of the CAM 100; in detail, the two PCM elements S1, S2 have the positive terminals connected to the supply voltage lines $PL1_j$, $PL2_j$, respectively.

This further embodiment of the CAM cell 105 exploits five transistors M1p, M2p, M4p, M5n and M6n rather than four as in the above described embodiments. The negative terminals of the PCM elements are connected to the source terminals of the p-MOS transistors M1p and M2p, respectively. The p-MOS transistors M1p and M2p are controlled by the voltage at the wordline $WL_i$ (as in the above described embodiments) and have the drain terminals connected to the bitlines $BLL_j$ and $BLR_j$, respectively; in this way, the p-MOS transistors M1p and M2p act again as selecting elements for the PCM elements S1 and S2. Furthermore, the n-well of the p-MOS transistors M1p and M2p (i.e., the n-type semiconductor region(s) wherein the p-MOS transistors M1p and M2p are formed) is biased to the voltage at the writing control line $WCL_i$. The p-MOS transistor M4p has the source terminal connected to the match line $ML_i$ and the drain terminal connected to the reference voltage line $RL_i$, which is set to the ground voltage.

The n-MOS transistor M5n has a first drain/source terminal connected to the bitline $BLL_j$ (i.e., connected to the drain terminal of the p-MOS transistor M1p), a second drain/source terminal connected to the gate terminal of the p-MOS transistor M4p and the gate terminal connected to the negative terminal of the PCM element S2. Symmetrically, the n-MOS transistor M6n has a first drain/source terminal connected to the bitline $BLR_j$ (i.e., connected to the drain terminal of the p-MOS transistor M2p), a second drain/source terminal connected to the gate terminal of the p-MOS transistor M4p and the gate terminal connected to the negative terminal of the PCM element S1. Consequently, the second drain/source terminals of the n-MOS transistors M5n, M6n and the gate terminal of the p-MOS transistor M4p are connected together to the match node MG. The n-MOS transistors M5n, M6n act as switch elements controlled by the voltage reached at the negative terminals of the PCM elements S2, S1.

The four possible storage states for this CAM cell 105 are defined in Table 2.

TABLE 2

| S1 logic value | S2 logic value | CAM cell storage state |
|---|---|---|
| 0 | 0 | not allowed |
| 0 | 1 | 1 |
| 1 | 0 | 0 |
| 1 | 1 | Always Match (AM) |

When the PCM element S1 is set to the logic value 1 and the PCM element S2 is set to the logic value 0, the content bit is equal to 0; in the opposite case, the content bit is equal to 1 (again, the opposite convention can be adopted). The storage state in which both the two PCM elements S1 and S2 are set to the logic value 1 is referred to as an Always Match (AM) state, while the storage state in which both the two PCM elements S1 and S2 are set to the logic value 0 is not used.

During the writing operation, the wordline $WL_i$ and the two bitlines $BLL_j$ and $BLR_j$ are set to the ground voltage. The write control line $WCL_i$ is also set to the ground voltage, in order to correctly bias the diodes formed by the p-type source/drain regions of the transistors M1p and M2p and the respective n-type well wherein they are formed, thereby increasing the current flowing through the PCM elements S1 and S2. The supply voltage lines $PL1_j$ and $PL2_j$ are set to voltages adapted to permitting a suitable current pulse to be applied to the PCM elements S1, S2. The two PCM elements S1 and S2 are typically programmed sequentially and one of the two supply voltage line $PL1_j$, $PL2_j$ is set to a sufficiently high voltage (e.g., from 3 to 5 V), while the other one is set to the ground voltage. Particularly, when the logic value 0 has to be written in the PCM element S1, S2, the voltage applied to the respective supply voltage line $PL1_j$, $PL2_j$ is regulated by driver circuits (not shown in the drawing) for permitting the flow of the reset current $I_{reset}$ through the diode of the transistor M1p, M2p, and thus the PCM element S1, S2. When the logic value 1 has to be written in the PCM element S1, S2, the voltage applied to the respective supply voltage line $PL1_j$, $PL2_j$ is regulated by the driver circuits for permitting the flow of the set current $I_{set}$. The two PCM elements S1 and S2 could also be programmed in parallel, provided that the write control line $WCL_i$, (typically, a metal line), is sufficiently conductive.

Both the reading operation and the search operation are carried out by setting the reference voltage line $RL_i$ to the ground voltage, and the supply voltage lines $PL1_j$ and $PL2_j$ and the writing control line $WCL_i$ to the supply voltage $V_{dd}$. In particular, in order to sense the current flowing through the CAM cell 105, the wordline $WL_i$ is set to the wordline read voltage $V_{read}^{WL}$ (e.g., from 0.8 to 1.0 V) and both the bitlines $BLL_j$ and $BLR_j$ are set to a bitline read voltage $V^{readBL}$ (e.g., from 1 to 2 V).

Before starting a search operation, the bitlines $BLL_j$ and $BLR_j$ are both set to the supply voltage $V_{dd}$ (e.g., from 1 to 3 V), and a suitable positive voltage $V_{search}^{WL}$ is applied to the wordline, so as to turn the transistors M1p and M2p on. In this way, the source terminal of the p-MOS transistors M1p, M2p reaches the supply voltage $V_{dd}$, being the drain terminal thereof at the supply voltage $V_{dd}$, and the n-MOS transistors M5n and M6n are turned on, presetting the match node MG at the supply voltage $V_{dd}$, provided by the bitlines $BLL_j$, $BLR_j$, minus the threshold voltage of the transistors M5n, M6n (i.e., the p-MOS transistor M4p is kept turned off at this stage).

In order to carry out a search operation, the wordline $WL_i$ is kept to the search voltage $V_{search}^{WL}$. The search voltage $V_{search}^{WL}$ must be low enough to turn on the p-MOS transistors M1p and M2p, at the same time avoiding the risk of having the switch voltage $V_{switch}^{P}$ across the PCM elements S1 and S2. Thus, the search voltage $V_{search}^{WL}$ must satisfy the following conditions:

$$V_{search}^{WL} < V_{dd} - |V_{th1,2}|$$

and $$V_{search}^{WL} > V_{dd} - V_{switch}^{P} - |V_{th1,2}| + \Delta V,$$

where $V_{th1,2}$ is the threshold voltage of the p-MOS transistors M1p, M2p and $\Delta V$ is a security margin.

Let it now be supposed now that the content bit is 0 and that the input (search) bit is 1. For accomplishing the search operation, the bitline $BLR_j$ is set to a relatively low positive voltage $VL_L$, while the bitline $BLL_j$ is set to the supply voltage $V_{dd}$. Consequently, the voltage at the gate terminal of the n-MOS transistor M5n moves towards the low positive voltage $V_L$, set onto the bitline $BLR_j$, since the PCM element S2 exhibits a high resistance and the transistor M2p is on. On the contrary, the gate terminal of the n-MOS transistor M6n approaches the supply voltage $V_{dd}$, because the PCM element S1 exhibits a low resistance and the supply voltage line $PL1_j$ is set to the supply voltage $V_{dd}$. The n-MOS transistor M6n turns on, pulling the match node MG towards the low positive voltage $V_L$. Then, the p-MOS transistor M4p is turned on and the match line $ML_i$ is pulled down towards the ground voltage, provided by the reference voltage line $RL_i$, revealing the bit-mismatch (and a word-mismatch). It is underlined that the bitline $BLR_j$ needs not necessarily be set to the ground voltage, being sufficient to set the low positive voltage $V_L$, assuming that such a voltage has a value suitable to turn the p-MOS transistor M4p on ($V_L < V_{ML} - V_{th4}$, where $V_{th4}$ is the threshold voltage of the p-MOS transistor M4p).

When the input bit is 0, the bitline $BLR_j$ is set to the supply voltage $V_{dd}$, while the bitline $BLL_j$ is set to the low positive voltage $V_L$. Consequently, the voltage at the gate terminal of the n-MOS transistor M6n moves towards the supply voltage $V_{dd}$, provided by the supply voltage line $PL1_j$, because the PCM element S1 exhibits a low resistance. The gate terminal of the n-MOS transistor M5n is also at the supply voltage $V_{dd}$, provided by the bitline $BLR_j$, because the transistor M2p is on, and the match node MG thus moves to an intermediate voltage between the supply voltage $V_{dd}$ at the bitline $BLR_j$ and the low positive voltage $V_L$ at the bitline $BLL_j$. For this reason, it might be preferable not to set the voltage of the bitline $BLL_j$ too close to the ground voltage, so as to ensure that the p-MOS transistor M4p is kept turned off, revealing the bit-match condition (the match line $ML_i$ is kept at the preset voltage $V_{ML}$ if all the CAM cells 105 of a row reveal a bit-match).

In the AM storage state, the two n-MOS transistors M5n, M6n are turned on, because the two gate terminals thereof are always at the supply voltage $V_{dd}$, as in the above described matching condition (both the PCM elements S1, S2 exhibit a low resistance). In order to ensure that the transistor M4p is kept off, it might be preferable not to drive one of the two bitlines $BLR_j$, $BLL_j$ to the ground voltage, but to stop at a relative low positive voltage, e.g., the above mentioned voltage $V_L$. Also in this case the importance of the choice of the low search voltage $V_L$ is to be outlined.

Figure 5B:
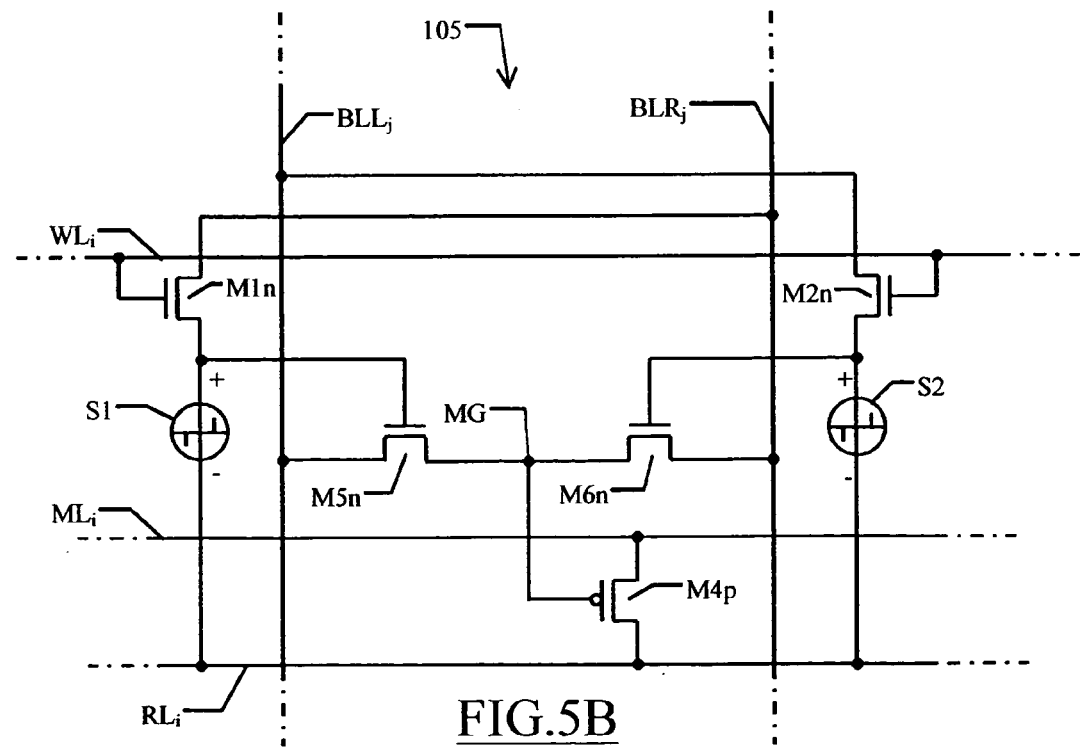
FIG. 5B shows a variation of the embodiment of FIG. 5A.

As shown in the alternative embodiment of FIG. 5B, the CAM cell 105 of FIG. 5A can be modified by substituting the p-MOS transistors M1p, M2p with the n-MOS transistors M1n, M2n. The N-MOS transistor M1n has the drain terminal connected to the bitline $BLR_j$, i.e., to the first drain/source terminal of the n-MOS transistor M6n. The n-MOS transistor M2n has the drain terminal connected to the bitline $BLL_j$, i.e., to the first drain/source terminal of the n-MOS transistor M5n. The positive terminal of the PCM element S1 is connected to the source terminal of the n-MOS transistors M1n and to the gate terminal of the n-MOS transistors M5n, while the negative terminal is connected to the reference voltage line $RL_i$, used to deliver the ground voltage. The positive terminal of the PCM element S2 is connected to the source terminal of the n-MOS transistors M2n and to the gate terminal of the n-MOS transistors M6n, while the negative terminal is connected to the reference voltage line $RL_i$.

The writing operation of the CAM cell 105 is accomplished in two steps, being the two PCM elements S1 and S2 programmed sequentially. A high voltage (e.g., from 3 to 5 V) is placed onto the wordline $WL_i$ and one of the bitlines $BLR_j$, $BLL_j$, while the other bitline is kept at the ground voltage. In particular, similarly to the above described embodiment of FIG. 5A, the bitline $BLL_j$, $BLR_j$ connected to the PCM element S1, S2 to be programmed is set (by driver circuits not shown in the drawing) to the voltage adapted to permit a suitable current pulse to flow through the respective PCM element S1, S2.

The four possible storage states for this further embodiment of CAM cell 105 are defined in Table 3.

TABLE 3

| S1 logic value | S2 logic value | CAM cell storage state |
|---|---|---|
| 1 | 1 | not allowed |
| 0 | 1 | 1 |
| 1 | 0 | 0 |
| 0 | 0 | Never Match (NM) |

The storage state in which both the two PCM elements S1, S2 are set to the logic value 0 is referred to as Never Match (NM) state, while the storage state in which both the two PCM elements S1, S2 are set to the logic value 1 is not allowed, for the reasons explained later on.

Before starting a search operation, both the bitlines $BLL_j$ and $BLR_j$ are preset to the supply voltage $V_{dd}$, and a sufficiently high positive voltage $V_{search}^{WL}$ is applied to the wordline $WL_i$, so as to turn the transistors M1n and M2n on. In this way, at least one of the n-MOS transistors M5n and M6n is turned on, presetting the match node MG to a voltage close to the supply voltage $V_{dd}$ minus the threshold voltage of the transistors M5n and M6n (i.e., the p-MOS transistor M4p is kept turned off).

The wordline search voltage $V_{search}^{WL}$ must be high enough to turn the n-MOS transistors M1n and M2n on, avoiding at the same time the risk of having the switch voltage $V_{switch}^{P}$ across the PCM elements S1 and S2. In this way, the wordline search voltage $V_{search}^{WL}$ must satisfy the following conditions:

$$V_{search}^{WL} > V_{th1,2}$$

and $$V_{search}^{WL} < V_{switch}^{P} + V_{th1,2} - \Delta V,$$

where $V_{th1,2}$ is the threshold voltage of the n-MOS transistors M1n, M2n.

Supposing that the content bit of the CAM cell is 1, when the input (search) bit is 1, the bitline $BLL_j$ is left at the supply voltage $V_{dd}$ and the bitline $BLR_j$ is set to the ground voltage. Both the n-MOS transistors M5n and M6n turn off, keeping also the p-MOS transistor M4p turned off (bit-match). On the contrary, when the input bit is 0, the bitline $BLL_j$ is set to the ground voltage and the bitline $BLR_j$ is set to the supply voltage $V_{dd}$. In this way the n-MOS transistor M5n turns on, moving the voltage at the match node MG towards the ground voltage and turning the p-MOS transistor M4p on. The match line $ML_i$ is thus pulled towards the ground voltage, revealing the bit-mismatch.

The NM storage state (both the PCM elements S1 and S2 exhibit a high resistance) permits to turn the p-MOS transistor M4p on both in the case in which the input bit is 1 and in the case in which the input bit is 0, achieving always a bit-mismatch.

It is observed that the storage state in which both the PCM elements S1, S2 exhibit a low resistance is not allowed because the match node MG could remain floating, and this condition has to be avoided.

In the CAM cell embodiment illustrated in FIG. 5B the n-MOS transistors preferably are low-threshold voltage transistors, in order to increase the speed and the reliability of the CAM cell 105. In fact, the transistors M5n and M6n are driven by the voltage drop across the PCM elements S1, S2, limited to a value lower than the switch value $V_{switch}^{P}$. If the transistors M5n, M6n have a low threshold voltage, the voltage swing at the gate terminal thereof can be more efficiently exploited for driving the match node MG, i.e., for transferring the bitline voltage to the match node MG.

Thanks to the fact that PCM elements are exploited as storage elements, the non-volatile CAM cell according to the present invention is faster than CAM cells exploiting floating gate transistors, especially in the write and erase operations. It is possible to accomplish a search operation in a time of the order of ten nanoseconds, while the time of a writing operation, although depending on the logic value to be programmed in the PCM elements, does not exceed the hundred of nanoseconds.

Moreover, the area occupied by the CAM cell on the semiconductor chip is smaller than that of the SRAM-based CAM cells (which moreover is volatile), due to the lower number of the transistors exploited and the compactness of the PCM elements.

It is observed that during a search operation, currents flow through the CAM cells, because the PCM elements are resistive components. However, this is not a major concern, because these currents, and consequently the power consumption, can be greatly reduced by carefully regulating the wordline search voltage $V_{search}^{WL}$.

Figure 6:
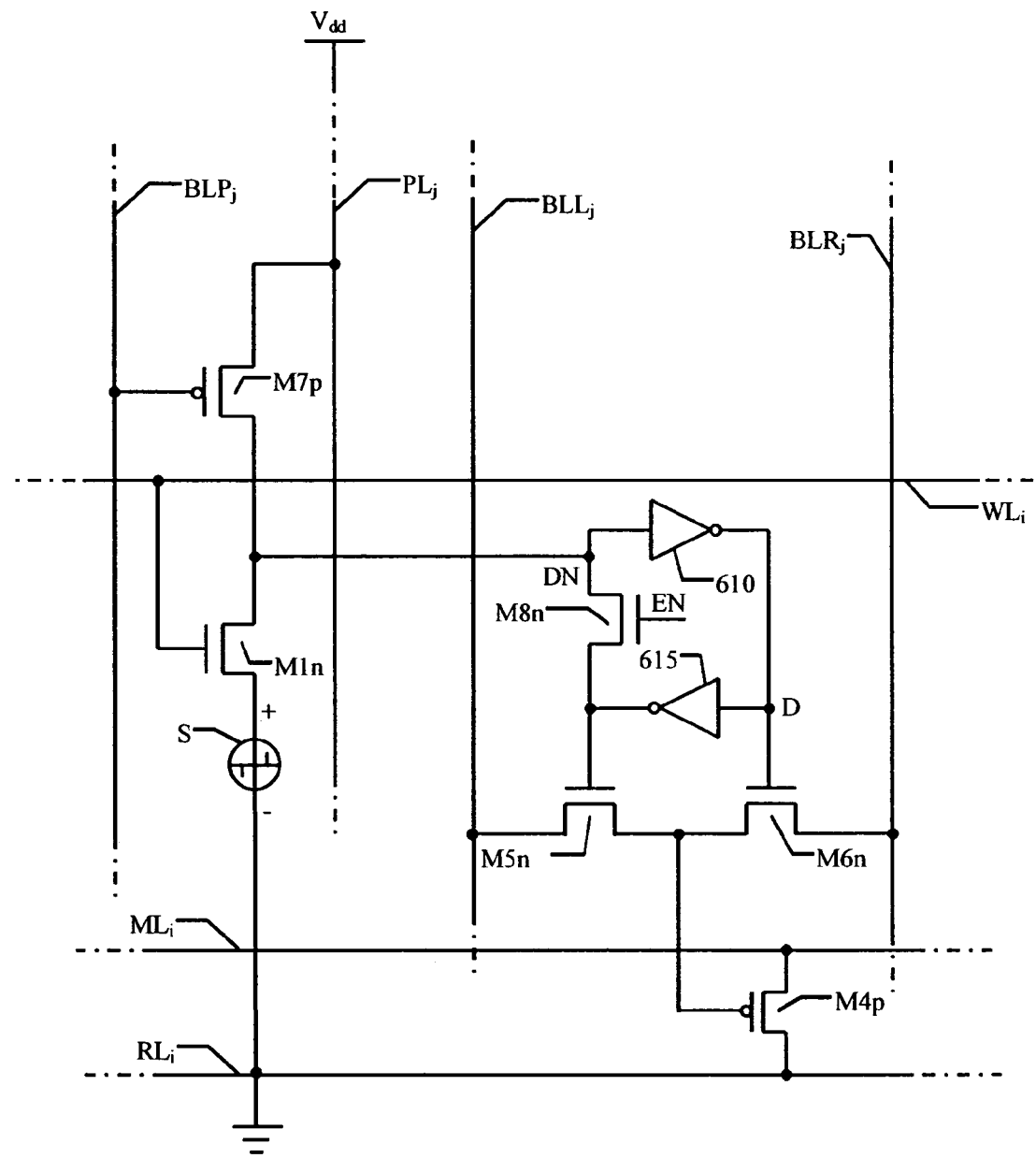
FIG. 6 shows a binary non-volatile CAM cell for a NOR-type CAM according to a further embodiment of the present invention.

FIG. 6 shows an alternative embodiment of the present invention adapted to reducing the power consumption during the search operations. The non-volatile CAM cell 105 according to this further embodiment of the invention has a split architecture, with a non-volatile part and a fast but volatile part.

The non-volatile part includes the n-MOS transistor M1n with the gate terminal connected to the wordline $WL_i$. The n-MOS transistor M1n acts as the selecting element for a PCM element S, having the positive terminal connected to the source terminal of the n-MOS transistor M1n and the negative terminal connected to the reference voltage line $RL_i$ (delivering the ground voltage). The non-volatile part of CAM cell 105 further includes a p-MOS transistor M7p with the source terminal connected to the supply voltage line $PL_j$, delivering the supply voltage $V_{dd}$. The p-MOS transistor M7p has the gate terminal connected to a bitline $BLP_j$, used for writing/reading the PCM element S, and the drain terminal connected to the drain terminal of the transistor M1n. The p-MOS transistor M7p is used to provide the suitable currents to the PCM element S during operation.

The volatile part of the CAM cell 105 includes two inverters 610 and 615, particularly CMOS inverters, and an n-MOS transistor M8n. The input terminal of the inverter 610 (node DN in the drawing) is connected to the drain terminal of the transistors M1n, M7p and to a first source/drain terminal of the transistor M8n, while the output terminal of the inverter 610 is connected to the input terminal of the inverter 615; the output terminal of the inverter 615 is connected to a second source/drain terminal of the transistor M8n. The transistor M8n receives an enabling signal EN at the gate terminal thereof; the enabling signal EN is generated inside the CAM 100 and can assume the value of the supply voltage $V_{dd}$, for turning the n-MOS transistor M8n on, or the value of the ground voltage, for turning the n-MOS transistor M8n off. In this pass transistor configuration the n-MOS transistor M8n acts as a controlled switch, which can open or close a loop formed by the two inverters 610, 615. When the loop 610, 615 is closed, the two inverters 610, 615 implement a volatile storage element (a latch) similar to a memory cell of a Static RAM memory. Furthermore, the volatile part of the CAM cell 105 includes the n-MOS transistors M5n, M6n and the p-MOS M4p. The n-MOS transistors M5n has the gate terminal connected to the output terminal of the inverter 615, while the n-MOS transistors M6n has the gate terminal connected to the input terminal of the inverter 615 (node D in the drawing). Similarly to the previous embodiments, the transistors M5n, M6n are connected to the two bitlines $BLL_j$, $BLR_j$, used during a search operation.

During a writing operation, the bitline $BLP_j$ is set to the ground voltage, and the p-MOS transistor M7p is turned on. In addition, the enabling signal EN is set to the ground voltage, in order to turn the n-MOS transistor M8n off and thus keep the loop 610, 615 open; in addition, the bitlines $BLL_j$ and $BLR_j$ are kept floating. In this way, the two inverters 610, 615 are not allowed to latch any logic value during the writing operation. Voltages $V_{set}^{WL}$, $V_{reset}^{WL}$ are placed on the wordline $WL_i$, allowing the flow of currents at least equal to the currents $I_{set}$, $I_{reset}$, respectively, through the PCM element S.

If the logic value 0 has to be written into the PCM element S, the reset voltage $V_{reset}^{WL}$ (typically, 3 V for this embodiment) is applied to the wordline $WL_i$. The reset voltage $V^{resetWL}$ at the gate terminal of the n-MOS transistor M1n has to assure that a current at least equal to the reset current $I_{reset}$ flows through the PCM element S, irrespective of the possible state of the phase-change material; in particular, the reset voltage $V_{reset}^{WL}$ has to be higher than the voltage $V^{switchP}$ for assuring a phase change in case the material is in the amorphous phase. The p-MOS transistor M7p, driven by a suitable bitline voltage, can be used as a current limiting device to limit the current to the reset value $I_{reset}$. The phase-change material, when cooled rapidly (e.g., by rapidly decreasing the reset voltage $V_{reset}^{WL}$ at the gate terminal of the n-MOS transistor M1) amorphizes exhibiting high resistance.

If the logic value 1 has to be written into the PCM element S, the set voltage $V_{set}^{WL}$ (typically, 1.5 V) is applied to the wordline $WL_i$. The set voltage $V_{set}^{WL}$ at the gate terminal of the n-MOS transistor M1 has to assure that a current at least equal to the set current $I_{set}$ flows through the PCM element S, irrespective of the possible state of the phase-change material; in particular, the set voltage $V_{set}^{WL}$ has to be at least equal to the switch value $V_{switch}^{P}$ for assuring a phase change in case the material is in the amorphous phase. Also in this case the p-MOS transistor M7p can be used as a current limiting device to limit the current to the set value $I_{set}$. The phase-change material, when cooled slowly (by slowly decreasing the voltage at the gate terminal of the n-MOS transistor M1n) crystallizes exhibiting low resistance.

The supply voltage line $PL_j$ can also be used as a verify line, enabling, for example, a Direct Memory Access (DMA) to the PCM element S of a selected CAM cell 105 in the matrix for establishing the status thereof by sensing the current.

It is observed that the non-volatile CAM cell 105 of the embodiment of FIG. 6 is binary, only two storage states being possible. The two storage states correspond to the logic complement of the logic value stored in the PCM element S. When the PCM element S stores the logic value 0, the CAM cell storage state is 1 and, when the PCM element S stores the logic value 1, the storage state is 0.

After the writing operation, the logic value, stored in the PCM element S, needs to be transferred at the node DN (transferring operation). The bitline $BLP_j$ is biased to a voltage such that the p-MOS transistor M7p is turned on and the node DN can be driven up/down by the current flowing through the PCM element S, for example the ground voltage. The wordline $WL_i$, controlling the transistor M1, has to be brought to a voltage lower than that used in the writing operation. In detail, a transferring value $V_T$ (typically, about 0.8 V) lower than the switch value $V_{switch}^{P}$, is placed on the wordline $WL_i$, in order to prevent any spurious programming of the PCM element S during the transferring operation, but suitable to keep the transistor M1n turned on; thus, the transferring value $V_T$ needs to be higher than the threshold voltage of the transistor M1n. During this transferring operation, the enabling signal EN is kept at the ground voltage and then the loop 610, 615 is kept open.

The PCM element S exhibits high resistance when the logic value 0 is stored therein, and the p-MOS transistor M7p pulls in this case the voltage at the node DN up towards the value of the supply voltage $V_{dd}$. On the contrary, the PCM element S exhibits low resistance when the logic value 1 is stored therein, and the n-MOS transistor M1 pulls the voltage at the node DN down towards the ground voltage.

As for the previous embodiments, before starting a search operation the match line $ML_i$ is preset to the preset voltage $V_{ML}$ and then, after the transferring operation, the enabling signal EN is set to the supply voltage $V_{dd}$ and the n-MOS transistor M8n turns on, closing the loop 610, 615. In a way similar to a volatile SRAM cell, the loop 610, 615 quickly latches the logic value corresponding to the value of the voltage at the node DN and provides the logic complement thereof at the node D. Consequently, when the node DN is at the ground voltage, the node D is at the supply voltage $V_{dd}$ and vice versa. It has to be observed that the transistors M7p, M1n can be turned off after the transferring operation.

Consequently, when the PCM element S stores the logic value 1, the node DN reaches a voltage value close to the ground voltage, turning the n-MOS transistor M5n off, while the node D reaches a voltage value close to the supply voltage Vdd, turning the n-MOS transistor M6n on. If the input bit 1 is being searched, the bitline $BLR_j$ is set to the supply voltage $V_{dd}$ and the bitline $BLL_j$ is set to the ground voltage. In this way, the n-MOS transistor M6n, turned on, pulls the match node MG towards the supply voltage $V_{dd}$, turning the p-MOS M4p off; the match line $ML_i$ is kept at the preset voltage $V_{ML}$, revealing the matching condition.

Otherwise, if the input bit 0 is being searched, the bitline $BLL_j$ is set to the supply voltage $V_{dd}$ and the bitline $BLR_j$ is set to the ground voltage. In this way, the n-MOS transistor M6n, turned on, pulls the match node MG towards the ground voltage turning the p-MOS M4p on; the match line $ML_i$ is discharged towards the ground voltage revealing the mismatching condition.

It is observed that the transferring operation is required not only after the programming operation of the CAM cell, but also at every power-on of the CAM 100. However, the simple structure of the CAM cell 105, that combines the properties of both non-volatile and volatile memory elements, permits a fast transferring operation, lasting only few tens of nanoseconds. During a search operation the PCM element needs not be sensed, i.e., the resistive element need not be run through by any current, consequently achieving a reduction of power consumption. In fact, the splitting of the CAM cell 105 into the non-volatile part and the fast part permits a separate use thereof.

Alternatively, the n-MOS transistor M8n, which is in pass transistor configuration, can be replaced by a CMOS pass transistor, if needed, for a better drive of the signal closing the loop 610, 615. Furthermore, the p-MOS transistor M4p, used for discharging the match line $ML_i$ in mismatching condition, can be replaced by a n-MOS transistor and the connections of the two gate terminals thereof has to be inverted. In this last case the preset operation must be executed by setting the bitlines $BLL_j$ and $BLR_j$ to the ground voltage.

However, the concepts of the present invention are also applicable when the CAM cells are connected to a different number of bitlines and supply voltage lines; similar considerations apply if the CAM cells are connected to different auxiliary lines, such as further control lines.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

Naturally, in order to satisfy specific requirements, a person skilled in the art may apply to the solution described above many modifications and alterations all of which, however, are included within the scope of protection of the invention as defined by the following claims.

The invention claimed is:

1. A content addressable memory cell for a non-volatile content addressable memory, comprising:
   a non-volatile storage element for storing a content digit;
   a selection input for selecting the memory cell;
   a search input for receiving a search digit; and
   a comparison circuit arrangement for comparing the search digit to the content digit and for driving a match output of the memory cell so as to signal a match condition between the content digit and the search digit, wherein said non-volatile storage element includes a phase-change memory element for storing in a non-volatile way the content digit.

2. The content addressable memory cell according to claim 1, further including a first switch device having a first terminal coupled to the match output, a second terminal coupled to a voltage input of the memory cell, the voltage input being configured to receive a supply voltage, and a control terminal driven by the comparison circuit arrangement for selectively coupling the match output to the voltage input.

3. The content addressable memory cell according to claim 2, further including switching means, coupled to a presetting input of the memory cell, for receiving a preset voltage, and coupled to the control terminal of the first switch device for selectively providing the preset voltage thereto in response to a preset signal.

4. The content addressable memory cell according to claim 3, wherein said non-volatile storage element includes:
   first and a second phase-change memory elements, each having a first terminal; and
   first and second selecting devices, each having a first terminal and a control terminal, said first terminal of the first and second phase-change memory elements being connected to the first terminal of the first and second selecting devices, respectively, and the control terminal of each one of the first and second selecting devices being coupled to the selection input of the memory cell.

5. The content addressable memory cell according to claim 4, wherein the switching means include a second switch device having a first terminal coupled to the presetting input of the memory cell, a second terminal coupled to the control terminal of the first switch device and a control terminal coupled to a control terminal of the memory cell for receiving the preset signal.

6. The content addressable memory cell according to claim 4, wherein each one of the first and second phase-change memory elements has a second terminal coupled to the search input of the memory cell, and each one of the first and second selecting devices has a second terminal coupled to the control terminal of the first switch device.

7. The content addressable memory cell according to claim 4, wherein each of the first and second phase-change memory elements has a second terminal coupled to a supply voltage input of the memory cell and each of the first and second selecting devices has a second terminal coupled to the search input of the memory cell.

8. The content addressable memory cell according to claim 7, wherein the switching means include second and third switch devices, each having a first terminal, a second terminal and a control terminal, the first terminals of the second and the third switch devices being coupled to the control terminal of the first switch device and the second terminals of the second and the third switch devices being coupled to the presetting input of the memory cell, the control terminal of each one of the second and the third switch devices being coupled to the first terminal of one of the first and second phase-change memory elements.

9. The content addressable memory cell according to claim 2, wherein said phase-change memory element has a first terminal and a second terminal, the memory cell further comprising:

a selecting arrangement having a control input and first and second input terminals, said control input of the selecting arrangement being coupled to the selection input of the memory cell, said first input terminal of the selecting arrangement being coupled to the first terminal of the phase-change memory element; and first and second supply voltage input terminals, the first supply voltage input terminal being coupled to said second input terminal of the selecting arrangement, and the second supply voltage input terminal being coupled to said second input terminal of the phase-change memory element.

10. The content addressable memory cell according to claim 9, further including switching means having first and second inputs and an output terminal, said first input being coupled to the search input of the memory cell for receiving the search digit, said second input being configured to receive the content digit and said output terminal being coupled to the control terminal of the first switch device.

11. The content addressable memory cell according to claim 10, further including a volatile storage element coupled to an output terminal of the non-volatile storage element in such a way that the content digit stored in non-volatile way in the non-volatile storage element is transferable to an input terminal of the volatile storage element, an output of the volatile storage element being coupled to the second input of the switching means for providing the content digit thereto.

12. The content addressable memory cell according to claim 11, wherein the volatile storage element comprises a circuit loop for latching the content digit, the circuit loop having an enabling terminal for selectively opening/closing the circuit loop.

13. A non-volatile content addressable memory, comprising:
an arrangement of a plurality of content addressable memory cells organized in a plurality of rows and in a plurality of columns, each content addressable memory cell of a respective one of the rows storing a respective content digit of a content word;
a plurality of word lines, each one for controlling a respective one of the rows of content addressable memory cells;
a plurality of bit lines, each one for controlling a respective one of the columns of content addressable memory cells; and
a plurality of match lines, each one associated with a respective one of the rows of content addressable memory cells, each match line providing a match signal in response to a match or a mismatch of the content word with an input word searched into the content addressable memory, wherein each of said content addressable memory cells includes:
a non-volatile phase-change memory element for storing a respective one of the content digits;
a selection input for selecting the memory cell and coupled to a respective one of the word lines;
a search input coupled to one of the bitlines and receiving a respective input digit of the input word;
a match output coupled to the respective match line; and
a comparison circuit for comparing the input digit to the content digit and for driving the match output so as to signal a match condition between the content digit and the input digit.

14. The non-volatile content addressable memory according to claim 13, wherein each of the content addressable memory cells includes a first switch device having a first terminal coupled to the match output of the memory cell, a second terminal coupled to a voltage input of the memory cell, and a control terminal driven by the comparison circuit for selectively coupling the match output to the voltage input, the content addressable memory further including a plurality of supply voltage lines configured to provide voltages to respective content addressable memory cells, the voltage input of each memory cell being coupled to the respective supply voltage line.

15. The non-volatile content addressable memory according to claim 14, wherein each of the content addressable memory cells includes a second switch device having a first terminal coupled to the presetting input of the memory cell, a second terminal coupled to the control terminal of the first switch device of the memory cell, and a control terminal coupled to a control terminal of the memory cell, the content addressable memory further comprising a plurality of control linesconfigured to provide respective control signals to respective content addressable memory cells, the control terminal of each content addressable memory cell being coupled to the respective control line.

16. A content addressable memory(CAM), comprising:
a plurality of CAM cells each storing a respective content value;
a plurality of match lines, each associated with a respective one of the CAM cells, each match line providing a match signal in response to a match or a mismatch of the content value of the associated CAM cell with an input value searched into the associated CAM cell, wherein each of the CAM cells includes:
a first phase-change memory element;
a selection input for selecting the CAM cell;
a search input receiving the input value; and
matching means for determining whether there is a match between the input value searched into the CAM cell and the content value of the CAM and providing the match signal to the match line associated with the CAM cell.

17. The CAM of claim 16, wherein each matching means includes a first switch device having a first terminal coupled to the associated match line, a second terminal coupled to a first voltage reference, and a control terminal coupled to the phase-change memory element of the CAM cell in which the matching means is included, to selectively couple the associated match line to the first voltage reference depending on the content value of the CAM cell.

18. The CAM of claim 17, wherein each matching means includes a second switch device coupled between the control terminal of the first switch device and a second voltage reference, the second switch device being configured to selectively provide the second voltage reference to the control terminal of the first switch device.

19. The CAM of claim 17, wherein each CAM cell includes:
a second phase-change memory element that stores the content value of the CAM cell in conjunction with the first phase-change memory element of the CAM cell, each of the memory elements having a first terminal; and
first and second selecting devices coupled between the control terminal of the first switch device and the first terminals of the first and second phase-change memory elements, respectively.

20. The CAM of claim 16, wherein each CAM cell includes:
a second phase-change memory element that stores the content value of the CAM cell in conjunction with the first phase-change memory element of the CAM cell.

21. The CAM of claim 16, wherein each CAM cell includes a volatile storage element coupled to an output terminal of the phase-change memory element of the CAM cell in such a way that the content value stored in the phase-change memory element is transferable to an input terminal of the volatile storage element, an output of the volatile storage element being coupled to the matching means of the CAM cell.

22. The CAM of claim 21, wherein each matching means includes:
- a first switch device having a first terminal coupled to the associated match line, a second terminal coupled to a voltage reference, and a control terminal; and
- a second switch device having a control terminal coupled to the output of the volatile storage element of the CAM cell in which the matching means is included, a first terminal coupled to the search input of the CAM cell in which the matching means is included, and a second terminal coupled to the control terminal of the first switch device of the matching means.

23. The CAM of claim 21, wherein the volatile storage element comprises a latch circuit that latches the content value of the CAM cell in which the volatile storage element is included.

* * * * *